US010614756B2

(12) United States Patent
Matsueda et al.

(10) Patent No.: US 10,614,756 B2
(45) Date of Patent: Apr. 7, 2020

(54) DISPLAY APPARATUS WITH IMPROVED HYSTERESIS CHARACTERISTICS, AND DISPLAY METHOD

(71) Applicant: NLT TECHNOLOGIES, LTD., Kawasaki, Kanagawa (JP)

(72) Inventors: Yojiro Matsueda, Kawasaki (JP); Buxiang Zhang, Kawasaki (JP); Yoshihiro Nonaka, Kawasaki (JP)

(73) Assignee: TIANMA MICROELECTRONICS CO., LTD., Chenzhen (CN)

( * ) Notice: Subject to any disclaimer, the term of this patent is extended or adjusted under 35 U.S.C. 154(b) by 7 days.

(21) Appl. No.: 15/492,598

(22) Filed: Apr. 20, 2017

(65) Prior Publication Data

US 2017/0309228 A1    Oct. 26, 2017

(30) Foreign Application Priority Data

Apr. 22, 2016    (JP) .................................. 2016-086321

(51) Int. Cl.
*G09G 3/3233* (2016.01)
*G09G 3/3275* (2016.01)
(Continued)

(52) U.S. Cl.
CPC ......... *G09G 3/3233* (2013.01); *G09G 3/3258* (2013.01); *G09G 3/3266* (2013.01); *G09G 3/3275* (2013.01); *H01L 27/3262* (2013.01); *H01L 27/3276* (2013.01); *G09G 2300/0426* (2013.01); *G09G 2310/0237* (2013.01); *G09G 2310/08* (2013.01); *G09G 2320/0209* (2013.01); *G09G 2320/043* (2013.01);
(Continued)

(58) Field of Classification Search
CPC .. G09G 3/3208; G09G 3/30; G09G 2320/045; G09G 3/3266; G09G 3/3233
See application file for complete search history.

(56) References Cited

U.S. PATENT DOCUMENTS

2003/0067424 A1    4/2003  Akimoto et al.
2008/0150846 A1    6/2008  Chung
(Continued)

FOREIGN PATENT DOCUMENTS

JP    2003122301 A     4/2003
JP    2008-158477 A    7/2008
(Continued)

OTHER PUBLICATIONS

Communication dated Feb. 6, 2020 issued by the Japanese Patent Office in counterpart Application No. 2016-086321.

*Primary Examiner* — Yuzhen Shen

(74) *Attorney, Agent, or Firm* — Sughrue Mion, PLLC

(57) ABSTRACT

A display apparatus includes: a first wiring, a second wiring, and a third wiring; a light emitting element configured to emit light due to a current flowing between an anode electrode and a cathode electrode; a driving transistor configured to control a current which is supplied from the first wiring to the anode electrode; a first switch configured to connect or disconnect the second wiring and a gate electrode of the driving transistor; a second switch configured to connect or disconnect the third wiring and the anode electrode; and a switching circuit configured to selectively apply one of an image signal voltage and a first voltage to the second wiring.

15 Claims, 17 Drawing Sheets

(51) Int. Cl.
*G09G 3/3258* (2016.01)
*G09G 3/3266* (2016.01)
*H01L 27/32* (2006.01)

(52) U.S. Cl.
CPC ............ *G09G 2320/064* (2013.01); *G09G 2320/0646* (2013.01); *G09G 2330/025* (2013.01); *G09G 2330/12* (2013.01)

(56) References Cited

U.S. PATENT DOCUMENTS

| | | | |
|---|---|---|---|
| 2009/0213046 A1* | 8/2009 | Nam | G09G 3/3233 345/76 |
| 2011/0227505 A1* | 9/2011 | Park | H05B 33/0896 315/297 |
| 2012/0147060 A1 | 6/2012 | Jeong | |
| 2012/0187425 A1 | 7/2012 | Omoto | |
| 2014/0176520 A1* | 6/2014 | Hwang | G09G 3/003 345/211 |
| 2014/0184665 A1* | 7/2014 | Yoon | G09G 3/3241 345/691 |
| 2014/0333515 A1* | 11/2014 | In | G09G 3/3233 345/82 |
| 2015/0035734 A1* | 2/2015 | Lee | G09G 3/3258 345/76 |
| 2015/0102303 A1* | 4/2015 | Kim | H01L 27/3262 257/40 |

FOREIGN PATENT DOCUMENTS

| | | |
|---|---|---|
| JP | 2012-128386 A | 7/2012 |
| JP | 2012-155953 A | 8/2012 |

\* cited by examiner

F I G. 1
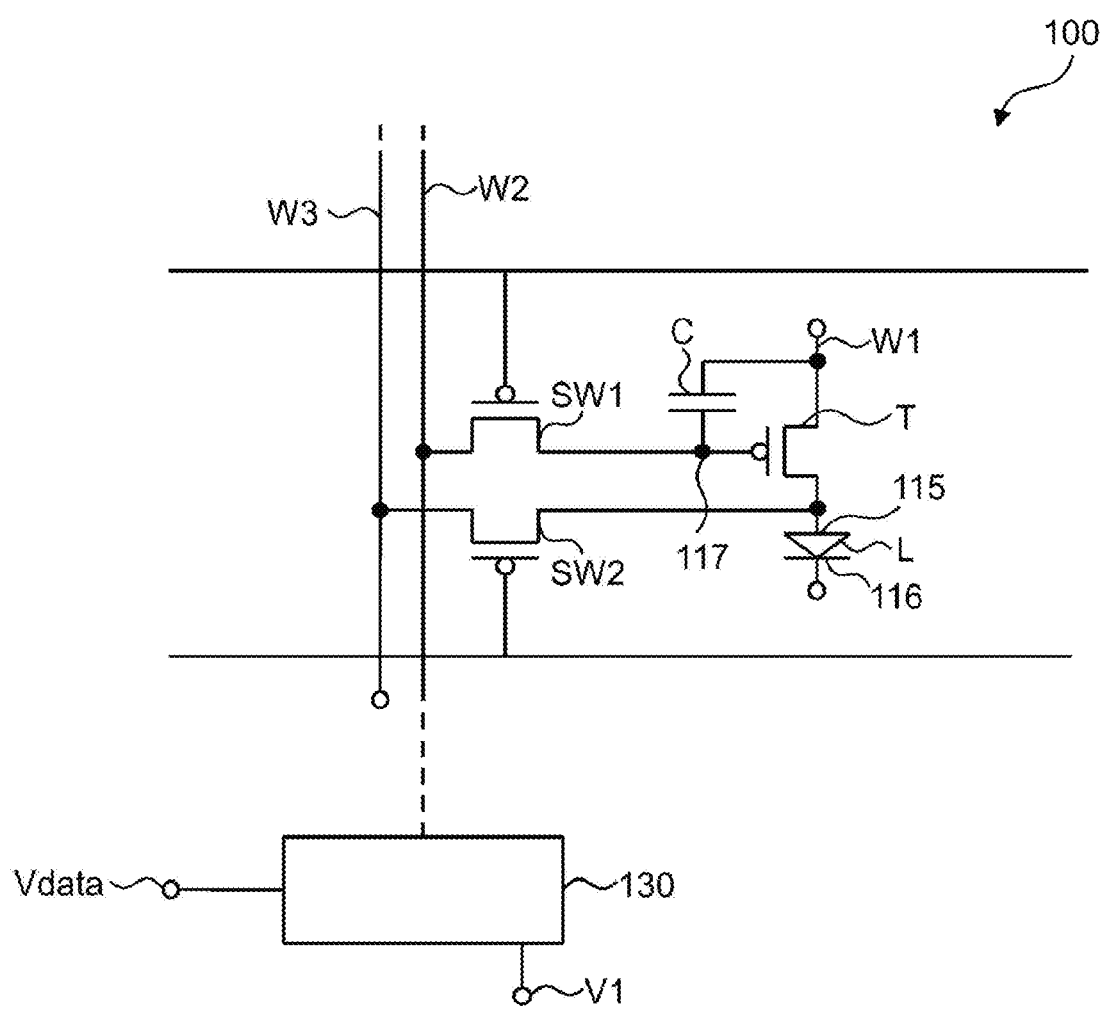

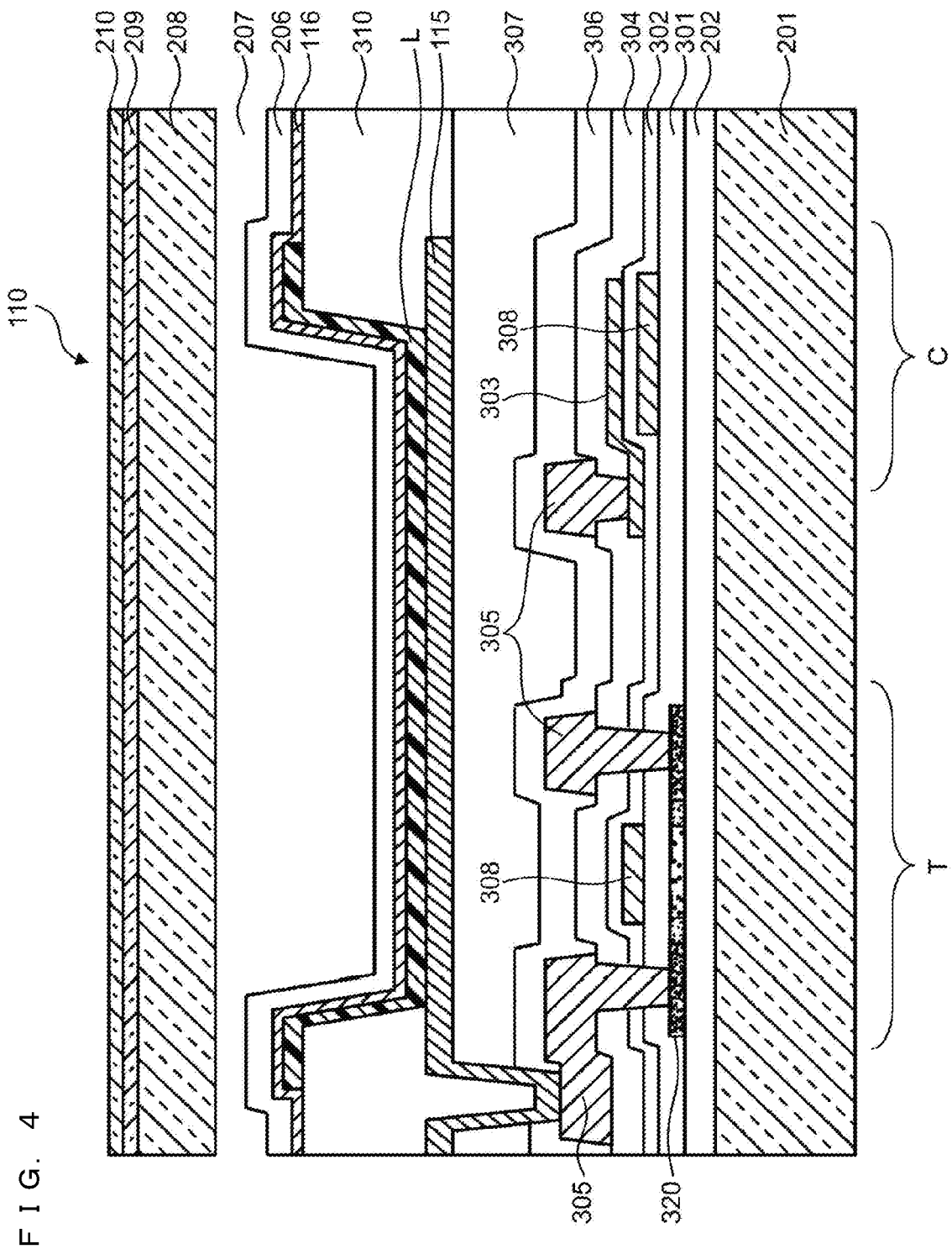
F I G. 4

F I G. 8

|  | TM1 | TM2 | TM3 | TM4 | TM5 | TM6 |
|---|---|---|---|---|---|---|
| SC1 | OFF | ON | ON | ON | ON | OFF |
| SC2 | OFF | ON | ON | OFF | OFF | OFF |
| SL2 | OFF | OFF | ON | OFF | OFF | OFF |
| SL1 | OFF | OFF | OFF | OFF | ON | ON |

DISPLAY APPARATUS WITH IMPROVED HYSTERESIS CHARACTERISTICS, AND DISPLAY METHOD

CROSS-REFERENCE TO RELATED APPLICATIONS

This non-provisional application claims priority under 35 U.S.C. § 119(a) on Patent Application No. 2016-086321 filed in Japan on Apr. 22, 2016, the entire contents of which are hereby incorporated by reference.

FIELD

The disclosure relates to a display apparatus and a display method of the display apparatus.

BACKGROUND

A so-called self-emission type display apparatus (hereinafter appropriately abbreviated to a display apparatus) using OLED (Organic Light Emitting Diode) has been practically used. In such a display apparatus, each pixel emits light by itself. Accordingly, such a display apparatus is excellent in view of visibility and a response speed. Since such a display apparatus does not require an auxiliary lighting unit such as a backlight, it is possible to further decrease the thickness of the display apparatus.

Such a display apparatus is disclosed in Japanese Patent Application Laid-Open No. 2012-155953, Japanese Patent Application Laid-Open No. 2008-158477, and Japanese Patent Application Laid-Open No. 2012-128386.

A display apparatus includes a plurality of pixels and each pixel includes, for example, a light emitting element and a driving transistor that controls a current to be supplied to the light emitting element. Emission luminance of the light emitting element is controlled depending on the current supplied thereto.

The driving transistor has hysteresis characteristics in which IV characteristic varies in an ON state and an OFF state (hereinafter, appropriately abbreviated to hysteresis). Image quality of the display apparatus may decrease due to the hysteresis. The reason of the decrease in image quality is that, for example, even when a predetermined voltage corresponding to predetermined emission luminance is applied to the gate of the driving transistor, a current corresponding to the predetermined emission luminance does not flow in the light emitting element due to the hysteresis and the light emitting element does not emit light with the predetermined emission luminance.

SUMMARY

According to an aspect of the present disclosure, there is provided a display apparatus including: a first wiring, a second wiring, and a third wiring; a light emitting element configured to emit light by a current flowing between an anode electrode and a cathode electrode; a driving transistor configured to control a current which is supplied from the first wiring to the anode electrode; a first switch configured to connect or disconnect the second wiring and a gate electrode of the driving transistor; a second switch configured to connect or disconnect the third wiring and the anode electrode; and a switching circuit configured to selectively apply one of an image signal voltage and a first voltage to the second wiring.

It is to be understood that both the foregoing general description and the following detailed description are exemplary and explanatory and are not restrictive of the invention.

BRIEF DESCRIPTION OF THE DRAWINGS

FIG. 1 is a diagram illustrating a configuration of a display apparatus according to a first embodiment;

FIG. 4 is a diagram illustrating an example of a cross-section of a pixel;

FIG. 8 is a table indicating switch states in each period of a horizontal synchronization period;

DETAILED DESCRIPTION

Figure 2:
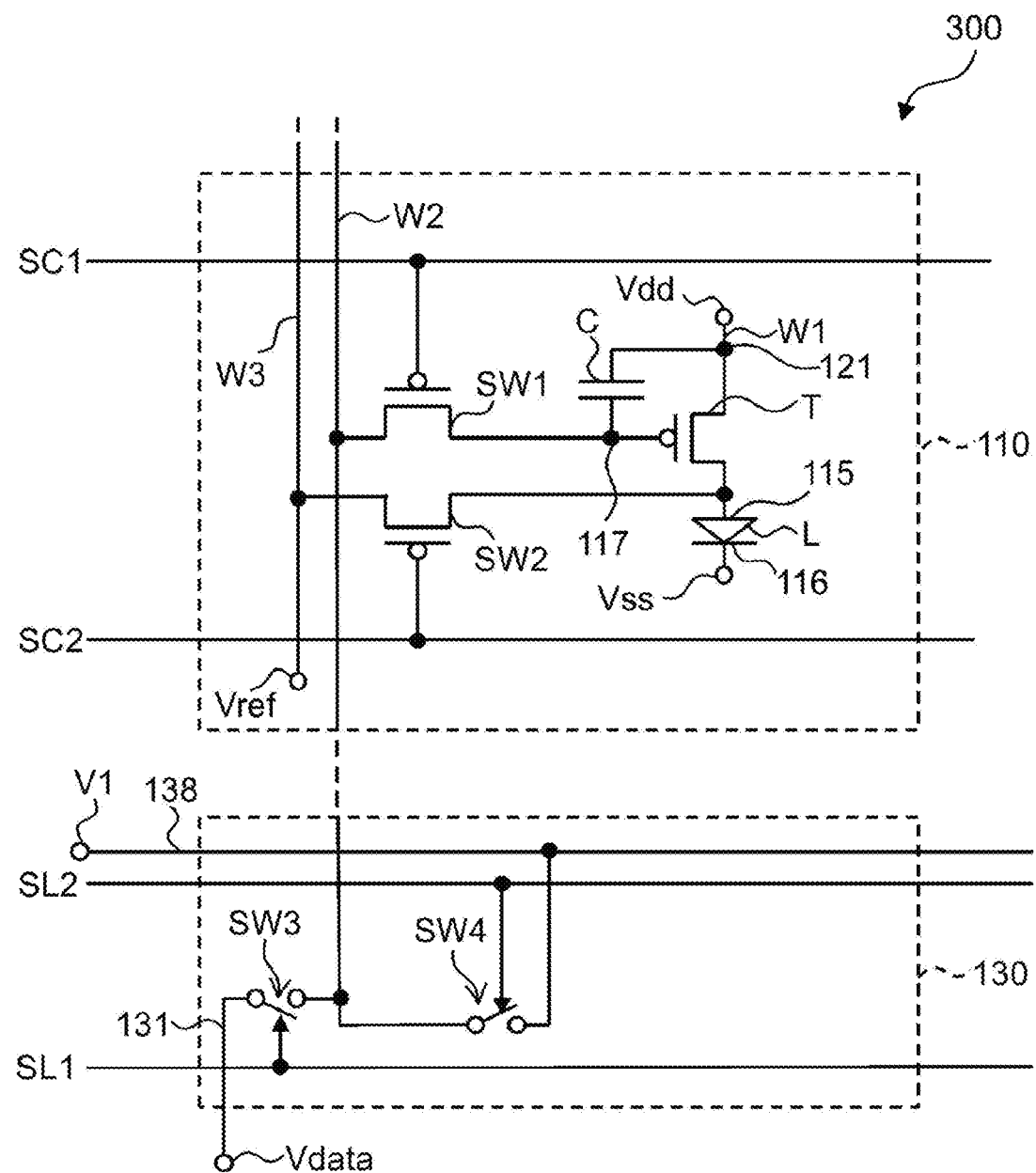
FIG. 2 is a diagram illustrating a configuration of a display apparatus according to a second embodiment.

Hereinafter, embodiments of display apparatuses will be described with appropriate reference to the accompanying drawings. The ordinal numbers such as "first" and "second" in the specification and the claims are used to clarify relationships between elements and to prevent confusion of the elements. Accordingly, such ordinal numbers do not numerically limit the elements.

The dimensions or ratios of the illustrated elements may not match the elements of an actual object. For the purpose of convenience of illustration or description for drawings, some elements included in an actual object may be omitted or the dimensions of the illustrated elements may be greater than those of the elements included in an actual object.

A term "connection" refers to electrical connection between connection targets. The term "electrical connection" includes the concept in which connection targets are connected to each other via an electrical element such as an electrode, a wiring, a resistor, or a capacitor. The terms "electrode" and "wiring" do not functionally limit the elements. For example, a "wiring" may be used as a part of an "electrode." On the other hand, an "electrode" may be used as a part of a "wiring."

[First Embodiment]

FIG. 1 is a diagram illustrating a configuration of a display apparatus 100 according to a first embodiment. As illustrated in the drawing, the display apparatus 100 includes a first wiring W1, a second wiring W2, a third wiring W3, a light emitting element L, a driving transistor T (in other words, "transistor T"), a first switch SW1, a second switch SW2, and a switching circuit 130. Here, the light emitting element L emits light depending on a current flowing between an anode electrode 115 and a cathode electrode 116. The transistor T controls a current supplied from the first wiring W1 to the anode electrode 115.

The first switch SW1 connects or disconnects the second wiring W2 and a gate electrode 117 of the transistor T. In other words, the first switch SW1 is disposed between the second wiring W2 and the gate electrode 117 of the transistor T and controls electrical connection between the second wiring W2 and the gate electrode 117 of the transistor T.

The second switch SW2 connects or disconnects the third wiring W3 and the anode electrode 115. In other words, the second switch SW2 is disposed between the third wiring W3 and the anode electrode 115 and controls electrical connection between the third wiring W3 and the anode electrode 115.

The switching circuit 130 selectively applies one of an image signal voltage Vdata and a first voltage V1 to the second wiring W2.

Here, it is preferable that the display apparatus 100 reset the anode electrode 115 to a non-emitting state (also referred to as a black level) with a potential supplied from the third wiring W3 in a state in which the second switch SW2 is turned on. The display apparatus 100 supplies the first voltage V1 from the switching circuit 130 to the second wiring W2 at a predetermined timing with a predetermined potential after resetting. The first voltage V1 is supplied to the gate electrode 117 of the transistor T that drives the light emitting element L. The first voltage V1 is a voltage causing a current equal to or greater than a minimum current for keeping the hysteresis of the transistor T in a channel ON state to flow in the transistor T. For example, the first voltage V1 is equal to or more than a threshold voltage of the driving transistor T. Thereafter, the display apparatus 100 supplies a normal image signal voltage Vdata from the switching circuit 130 to the second wiring W2.

By employing the above-mentioned configuration, a desired image signal voltage Vdata can be applied (written) to the gate electrode 117 of the transistor T in a state in which the hysteresis of the transistor T is always fixed to an ON state. Accordingly, in the display apparatus 100 according to this embodiment, it is possible to suppress a decrease in image quality due to the hysteresis of the IV characteristics in the ON state and the OFF state of the transistor T. The reason of the decrease in image quality is that, for example, even when a predetermined voltage corresponding to predetermined emission luminance is applied to the gate of the driving transistor, a current corresponding to the predetermined emission luminance does not flow in the light emitting element due to the hysteresis and the light emitting element does not emit light with the predetermined emission luminance. The hysteresis of the transistor T will be described later in detail with reference to FIG. 5.

In the display apparatus 100 according to this embodiment, the circuit that executes display control includes only three elements of the transistor T and the switches SW1 and SW2. Accordingly, in the display apparatus 100 according to this embodiment, it is possible to improve a yield in microprocessing and to secure a wide light emitting region in which the switch and the like are not formed to enhance emission efficiency. In the display apparatus 100 according to this embodiment, since a wide light emitting region can be secured, it is possible to maintain a satisfactory amount of light emitted even when a total area including the switch and the like and the light emitting region is further refined. That is, in the display apparatus 100 according to this embodiment, it is possible to achieve an increase in precision while maintaining a satisfactory amount of light emitted. In this embodiment, a P-type transistor is used, but an N-type transistor may be used.

[Second Embodiment]

FIG. 2 is a diagram illustrating a configuration of a display apparatus 300 according to a second embodiment. The display apparatus 300 according to the second embodiment includes the same configuration as the display apparatus 100 according to the first embodiment and an example of a specific configuration of the switching circuit 130 will be described. Accordingly, the same elements as in FIG. 1 will be referenced by the same reference numerals, description of the first embodiment is incorporated herein by reference, and description thereof will not be repeated.

The display apparatus 300 includes a capacitor C connected between the gate electrode 117 and a source electrode 121 of the transistor T. The light emitting element L, the transistor T, the capacitor C, the first switch SW1, the second switch SW2, the first wiring W1, the second wiring W2, and the third wiring W3 constitute a pixel 110.

The gate of the transistor constituting the first switch SW1 is supplied with a first scan signal SC1. The gate of the transistor constituting the second switch SW2 is supplied with a second scan signal SC2. The image signal voltage Vdata is applied to an image signal line 131. The third switch SW3 connects or disconnects the second wiring W2 and the image signal line 131. The third switch SW3 is controlled by a first selection signal SL1. The first voltage V1 is applied to a first voltage line 138. A fourth switch SW4 connects or disconnects the second wiring W2 and the first voltage line 138. The fourth switch SW4 is controlled by a second selection signal SL2. Here, a high-side potential Vdd in the display apparatus 300 may be applied to the first wiring W1 and a low-side potential Vss may be applied to the cathode electrode 116. Here, the first switch SW1, the second switch SW2, the third switch SW3, and the fourth switch SW4 may be constituted by a transistor that can realize a switch function switching the connection state between a connected state and a disconnected state. The transistor T may be a transistor which is used in a saturation region.

Figure 3:
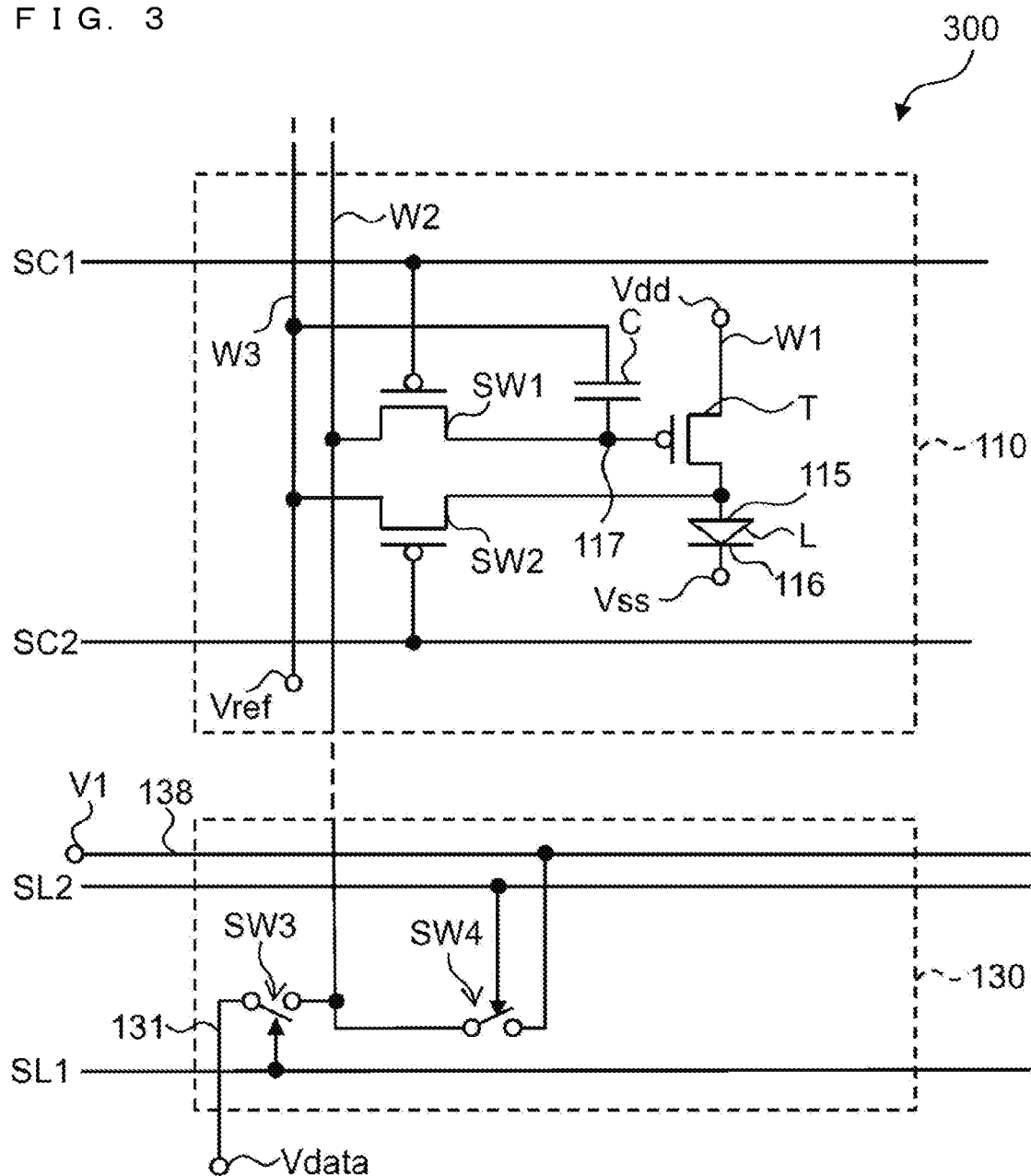
FIG. 3 is a diagram illustrating a configuration of a display apparatus according to a modified example of the second embodiment.

In FIG. 2, the capacitor C forms a capacitance between the gate electrode 117 and the source electrode 121 of the transistor T. Otherwise, the capacitor C may form a capacitance between the gate electrode 117 and another electrode connected to a fixed potential. FIG. 3 is a diagram illustrating a configuration of a display apparatus according to a modified example of the second embodiment. In FIG. 3, a configuration in which another electrode is connected to the third wiring W3 to which a reference voltage Vref is applied as a fixed potential is illustrated.

FIG. 4 is a diagram illustrating an example of a cross-section of the pixel 110. In the cross-sectional view, the transistor T, the capacitor C, and the light emitting element L are illustrated. The transistor T is formed on an insulating base film 202 which is formed on an insulating substrate 201 such as a glass substrate. A semiconductor layer 320 is formed on the insulating base film 202, impurities are applied to the semiconductor layer 320 such that an amount of impurities decreases from both ends of the semiconductor layer 320 to the center thereof, and the semiconductor layer is partitioned a P+ layer, a P− layer, and an i layer. A gate insulating film 301 is formed on the semiconductor layer 320, and a gate metal 308 is formed as a wiring using Mo (molybdenum) or the like on the gate insulating film 301. The gate metal 308 corresponds to the gate electrode 117 illustrated in FIG. 2. A first insulating interlayer film 302 and a second insulating interlayer film 304 are sequentially formed on the gate metal 308, and a capacitor electrode metal 303 serving as one electrode of the capacitor C is formed using Mo or the like between the first insulating interlayer film 302 and the second insulating interlayer film 304. A source/drain metal 305 connected to the capacitor electrode metal 303 and the semiconductor layer 320 via a through-hole is formed on the second insulating interlayer film 304. The source/drain metal 305 may be formed in a stacked structure of Ti/Al/Ti or the like or may be formed using other conductor. A passivation film 306 and a planarization film 307 are formed on the source/drain metal 305. The insulating films such as the insulating base film 202, the gate insulating film 301, the first insulating interlayer film 302, and the second insulating interlayer film 304 are formed of an insulating film such as SiNx or SiOx.

The anode electrode 115 is formed on the planarization film 307. The anode electrode 115 is connected to the source/drain metal 305 (the source/drain metal on the left side of FIG. 4) of the transistor T via a through-hole. The cathode electrode 116 is formed on the anode electrode 115 with the light emitting element L including a plurality of layers interposed therebetween. The light emitting element L in contact with the anode electrode 115 emits light in a part in contact with the anode electrode 115. An end portion of the anode electrode 115 not in contact with the light emitting element L is covered with an element separation film 310 and the light emitting element L is disposed so as to extend from the anode electrode 115 over the element separation film 310. The cathode electrode 116 is formed so as to cover the light emitting element L and the element separation film 310.

A cap layer 206 is formed on the cathode electrode 116. A sealing glass 208 that seals dry air is disposed on the cap layer 206 to form a dry air layer 207. The cap layer 206, the dry air layer 207, and the sealing glass 208 serve to prevent moisture from entering a layer below the cathode electrode 116. A λ/4 phase difference film 209 and a polarizing film 210 are disposed on the sealing glass 208. The λ/4 phase difference film 209 and the polarizing film 210 may not be disposed thereon. The cross-sectional view and the configuration illustrated in FIG. 4 are an example of a cross-sectional configuration for embodying the circuit configuration illustrated in FIG. 3 and another cross-sectional configuration may be employed.

For example, as illustrated in FIG. 2, the third wiring W3 may be formed as a wiring extending in parallel to the second wiring W2. Although not illustrated in the cross-sectional view of FIG. 4, the third wiring W3 and the second wiring W2 may be formed in different layers. When the third wiring W3 and the second wiring W2 are formed in different layers, it is possible to prevent the potential of the third wiring W3 from varying with a variation in potential of the second wiring W2. The third wiring W3 may be connected to the cathode electrode 116. Accordingly, it is possible to apply the potential of the cathode electrode 116 to the anode electrode 115 via the second switch SW2 without newly disposing the third wiring W3.

Figure 5:
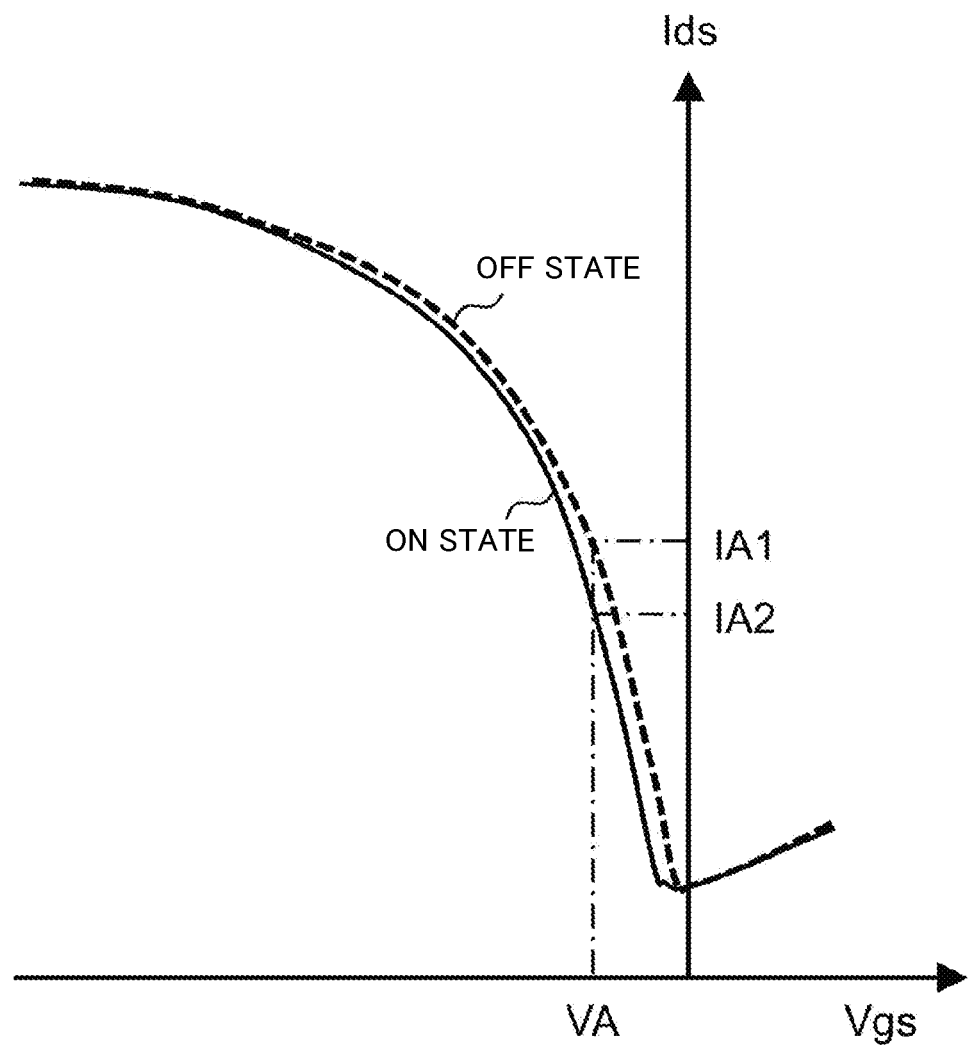
FIG. 5 is a graph illustrating an example of IV characteristics of a transistor.

FIG. 5 is a graph illustrating an example of IV characteristics of the transistor T, that is, characteristics of a source-drain current Ids with respect to a gate-source voltage Vgs. That is, FIG. 5 illustrates an example of the hysteresis of the transistor T. As illustrated in the graph, the IV characteristics in an OFF state (also referred to as a disconnected state) and the IV characteristics in an ON state (also referred to as a connected state) are different from each other. For example, in the OFF state, a first case in which a gate-source voltage VA corresponding to a certain gray-scale value (also referred to as luminance) is applied to the gate electrode 117 of the transistor T is assumed. In the first case, a current of a source-drain current IA1 in the IV characteristic curve in the OFF state flows in the transistor T.

Thereafter, a second case in which the gate-source voltage VA corresponding to the same gray-scale value is continuously applied to the gate electrode 117 of the transistor T is assumed. In the second case, the IV characteristics of the transistor T is changed to the IV characteristics in the ON state.

As described above, even when the same voltage is applied to the gate electrode 117 of the transistor T, the transistor T may cause different currents to the light emitting element L as in the first and second cases. For example, when the voltage VA is applied to the gate electrode 117 of the transistor T in the ON state of the transistor T, a current of a source-drain current IA2 which is lower than the source-drain current IA1 in the IV characteristic curve in the OFF state flows in the light emitting element L. When the source-drain current IA2 has a current value to flow in the light emitting element L, the source-drain current IA1 is higher than the current value (IA2) to flow. Accordingly, the light emitting element L may emit light with higher luminance. That is, the light emitting element L may not emit light with desired luminance due to the hysteresis of the transistor T driving the light emitting element L. In this case, image quality such as contrast decreases. Particularly, when luminance of each pixel is frequently changed such as when the display apparatus displays an image frame in which an image is rapidly changed like a moving image, so-called screen flickering can occur due to the hysteresis of the transistor T and thus image quality can be easily decreased.

Figure 6:
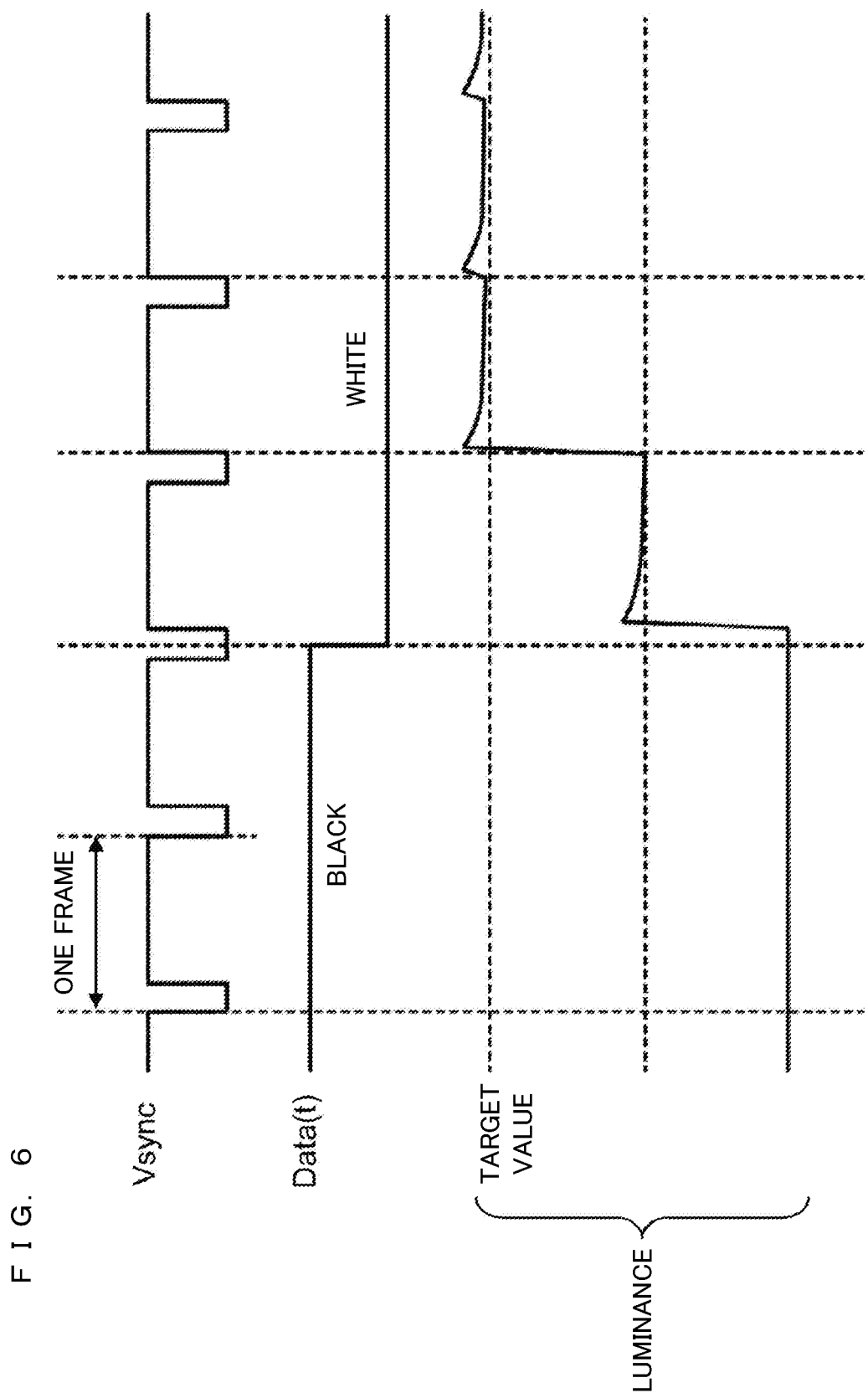
FIG. 6 is a diagram illustrating an example of image retention.

Furthermore, so-called image retention based on the hysteresis may occur. FIG. 6 is a diagram illustrating an example of image retention which is disclosed in Japanese Patent Application Laid-Open No. 2012-128386. In this case, when display is switched from black to white, the IV characteristics are different in black and white and thus the luminance of white is not achieved over one frame but two frames are required for achieving the luminance of white.

However, in the display apparatus 300 according to this embodiment, a desired image signal voltage Vdata is applied to the gate electrode 117 of the transistor T always in a state in which the hysteresis of the transistor T is fixed to the connected state (see the graph in the ON state in FIG. 5). Accordingly, in the display apparatus 300 according to this embodiment, it is possible to suppress a decrease in image quality due to the hysteresis.

Figure 7:
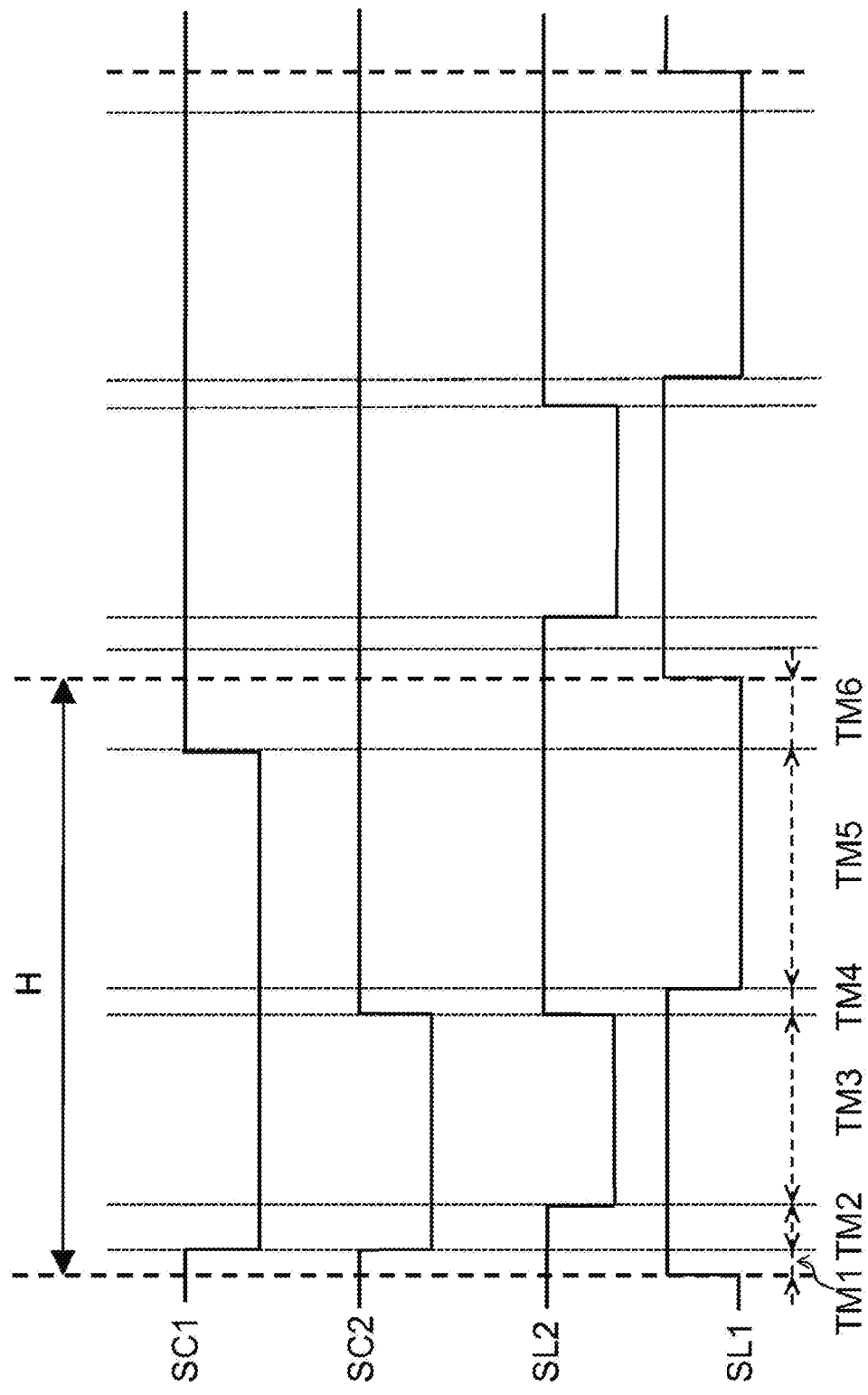
FIG. 7 is a timing chart illustrating an example of an operation in the circuit illustrated in FIG. 2.

FIG. 7 is a timing chart illustrating an example of an operation in the circuit illustrated in FIG. 2. FIG. 8 is a table indicating switch (transistor) states in each period TM1 to TM6 obtained by dividing a so-called horizontal synchronization period H in the timing chart illustrated in FIG. 7 into first to sixth periods TM1 to TM6 illustrated in FIG. 7. A high signal in the timing chart illustrated in FIG. 7 is OFF in FIG. 8, and a low signal therein is ON. As can be seen from the timing chart illustrated in FIG. 7 and the table illustrated in FIG. 8, all the first scan signal SC1, the second scan signal SC2, the first selection signal SL1, and the second selection signal SL2 are OFF in the first period TM1 of the horizontal synchronization period H. In the period TM2, the first scan signal SC1 and the second scan signal SC2 are changed to ON and both the first switch SW1 and the second switch SW2 are switched to the connected state. The reference voltage Vref applied to the third wiring W3 is applied to the anode electrode 115. Subsequently, in the third period TM3, the second selection signal SL2 is changed to ON and the fourth switch SW4 is switched to the connected state. Accordingly, the period in which the first switch SW1 is in the connected state, the period in which the second switch SW2 is in the connected state, and the period in which the switching circuit 130 applies the first voltage V1 to the second wiring W2 overlap each other and the first voltage V1 is applied to the gate electrode 117. The first voltage V1 is, for example, a minimum voltage for turning on the transistor T, that is, a threshold voltage. In other words, the first voltage V1 is a voltage for causing a current equal to or larger than a minimum current to flow to the transistor T such that the hysteresis of the transistor T is maintained in a channel ON state (see a solid line in the "ON state" in FIG. 5).

When the first voltage V1 is applied to the gate electrode 117 of the transistor T, the transistor T is turned on and a current flows in the transistor T. The hysteresis of the transistor T is maintained in the channel ON state by the current.

The period in which the first switch SW1 is in the connected state, the period in which the second switch SW2 is in the connected state, and the period in which the switching circuit 130 applies the first voltage V1 to the second wiring W2 overlap each other in at least a part. In other words, all of the period in which the first switch SW1 is in the connected state, the period in which the second switch SW2 is in the connected state, and the period in which the switching circuit 130 applies the first voltage V1 to the second wiring W2 do not have to overlap each other and, for example, the period in which the first switch SW1 is in the connected state and the period in which the switching circuit 130 applies the first voltage V1 to the second wiring W2 may partially overlap each other.

Here, the reference voltage Vref can be set to a voltage with which the light emitting element L does not emit light. The reference voltage Vref, that is, the voltage of the third wiring W3, may be set to be equal to or lower than a voltage obtained by adding the threshold voltage Vtholed of the light emitting element L to the voltage of the cathode electrode 116. When the reference voltage Vref is set to this voltage range and the second switch SW2 is switched to the connected state in the third period TM3, the current flowing in the transistor T bypasses the light emitting element L and flow to the third wiring W3. Since the current bypasses the light emitting element L in this way, no current flows in the light emitting element L. Accordingly, in the display apparatus 300 according to this embodiment, it is possible to control the light emitting element L not to emit light. The light emitting element L has self-capacitance for holding the voltage between the anode electrode 115 and the cathode electrode 116, when the voltage of the anode electrode 115 is equal to or lower than the voltage obtained by adding the threshold voltage Vtholed of the light emitting element L to the voltage of the cathode electrode 116. In this case, it is possible to suppress emission of light due to a leak current from the surrounding as will be described later.

The first voltage V1 can be set to be larger than the voltage of the cathode electrode 116. Accordingly, it is possible to prevent an excessive current from flowing in the transistor T. The first voltage V1 can be set to a voltage equal to or lower than a minimum voltage of an image signal voltage. Accordingly, the transistor T can be changed to a satisfactory ON state and the IV characteristics of the transistor T can be maintained in the ON state. The first voltage V1 may be higher than the reference voltage Vref which is a voltage applied to the third wiring W3. Accordingly, when the first switch SW1 and the third switch SW3 are turned on, it is possible to prevent an excessive current from flowing in the transistor T.

Subsequently, in the fourth period TM4, the second scan signal SC2 and the second selection signal SL2 are changed to OFF. In the fourth period TM4, since the fourth switch SW4 is changed to the disconnected state, the application of the first voltage V1 to the gate electrode 117 of the transistor T is stopped.

In the fifth period TM5, the first selection signal SL1 is changed to ON. That is, the third switch SW3 is switched to the connected state and the image signal voltage Vdata corresponding to desired emission luminance is applied to the gate electrode 117. At the time point at which the image signal voltage Vdata is applied to the gate electrode 117 of the transistor T, the hysteresis of the transistor T is maintained in the channel ON state.

In this way, in the period in which the first switch SW1 is in the connected state, the switching circuit 130 switches the voltage applied to the second wiring W2 from the first voltage V1 to the image signal voltage Vdata. Accordingly, a current corresponding to the image signal voltage Vdata flows in the light emitting element L, and the light emitting element L starts emission of light with luminance corresponding to the image signal voltage Vdata. In the sixth period TM6, the first scan signal SC1 is changed to OFF and the first selection signal SL1 is changed to OFF at the start time of a next horizontal synchronization period H. By this control, in the display apparatus according to this embodiment, the image signal voltage Vdata can be applied to the gate electrode 117 of the transistor T while the IV characteristics of the transistor T is maintained in the ON state by the first voltage V1. The connection state of the first switch SW1 may not be continuous while the first voltage V1 and the image signal voltage Vdata are switched and, for example, the first switch SW1 may be switched to the disconnected state at the switching timing between the first voltage V1 and the image signal voltage Vdata.

Figure 9:
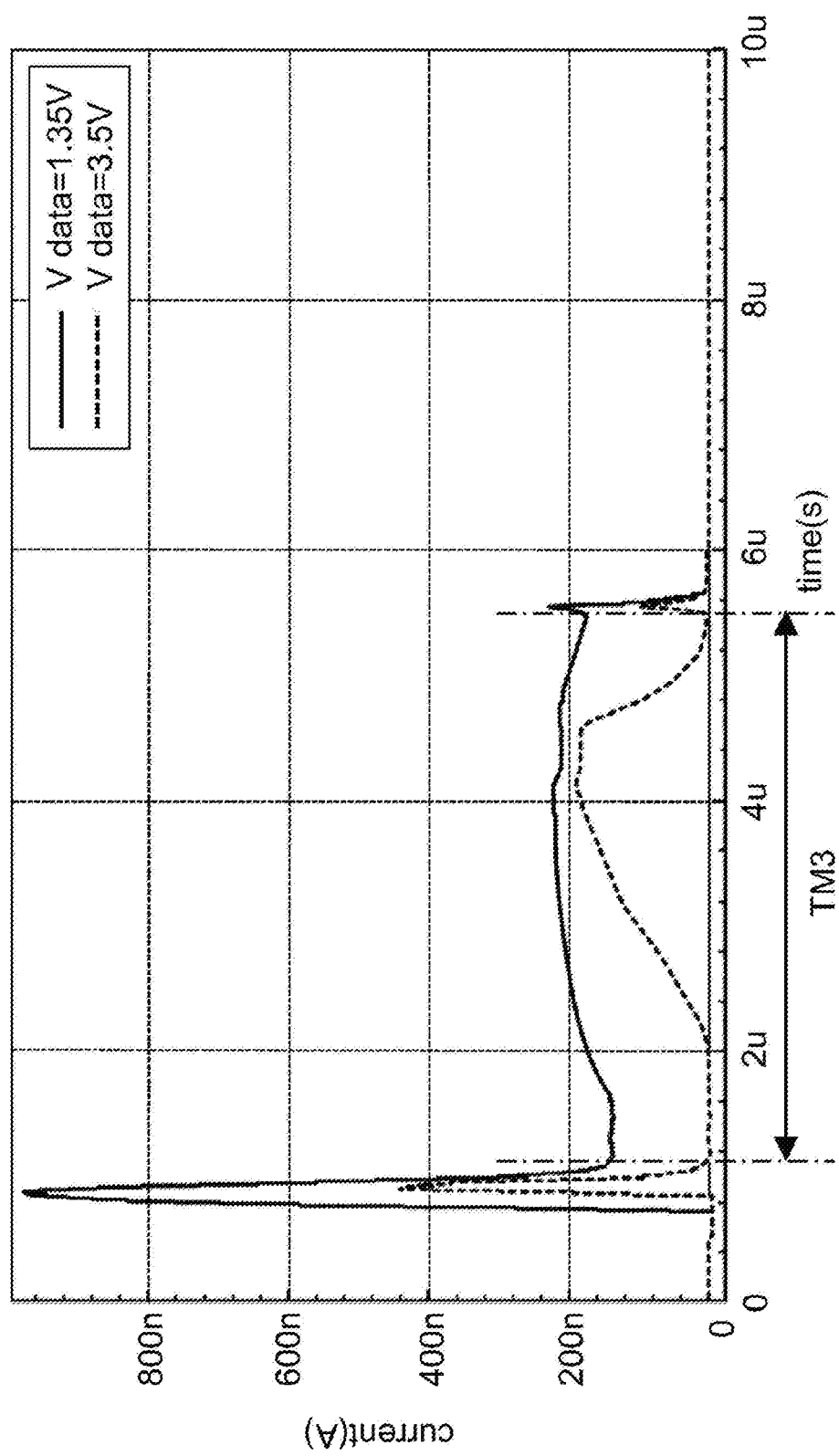
FIG. 9 is a graph illustrating a simulation result of current flowing in a second switch.

FIG. 9 is a graph illustrating a simulation result of the current flowing in the second switch SW2. Here, the current flowing in the second switch SW2 is a current flowing from the anode electrode 115 to the third wiring W3. A solid line indicates a case in which the image signal voltage Vdata=1.35 V with maximum luminance is applied to the gate electrode 117 of the transistor T in each frame. A broken line indicates a case in which the image signal voltage Vdata=3.5 V with minimum luminance is applied to the gate electrode 117 of the transistor T in each frame. In the third period TM3 in which the first voltage V1 is applied to the gate electrode 117 and the second switch SW2 is switched to the connected state, the transistor T is maintained in the ON state. However, as illustrated in the graph, the current flowing in the second switch SW2 is suppressed to 136 nA to 222 nA in the case of the image signal voltage Vdata (=1.35 V) with the maximum luminance and to 0 to 188 nA in the case of the image signal voltage Vdata (=3.5 V) with the minimum luminance.

Figure 10:
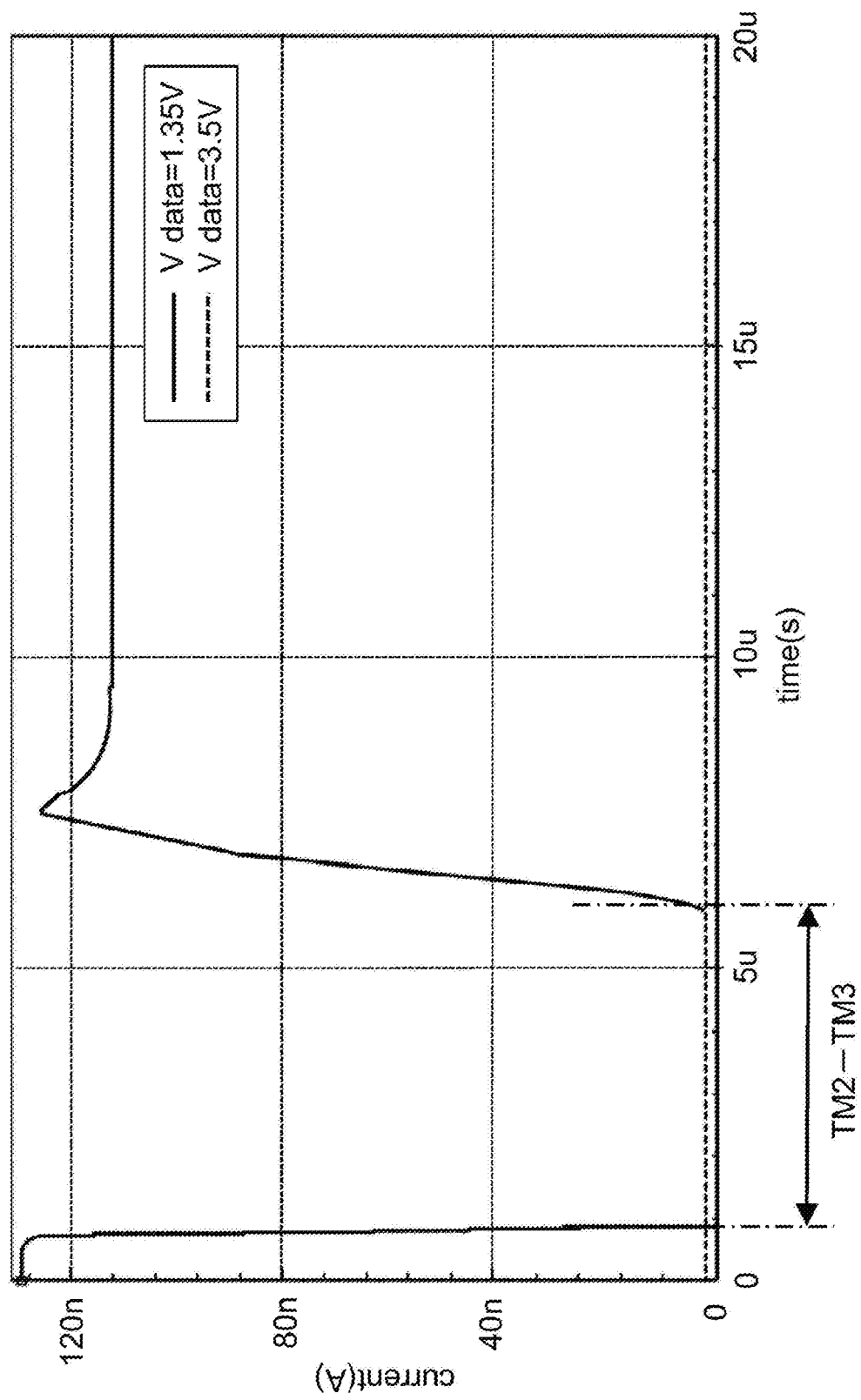
FIG. 10 is a graph illustrating a simulation result of current flowing in a light emitting element.

FIG. 10 is a graph illustrating a simulation result of the current flowing in the light emitting element L. A solid line indicates a case in which the image signal voltage Vdata=1.35 V with the maximum luminance is applied in each frame. A broken line indicates a case in which the image signal voltage Vdata=3.5 V with the minimum luminance is applied in each frame. As illustrated in the graph, a current hardly flows in the light emitting element L in the period in which the second scan signal SC2 is in the ON state in the second period TM2 and the third period TM3, which represents that this state is the same as a state in which the light emitting element L does not emit light, that is, the minimum luminance state.

Accordingly, according to this embodiment, it is possible to apply the image signal voltage Vdata after the transistor T is switched to the ON state without causing the light emitting element L to emit light. When the first voltage V1 and the reference voltage Vref which is a voltage to be applied to the third wiring W3 are appropriately selected, it is possible to decrease current consumption which is required for the ON state.

[Third Embodiment]

Figure 11:
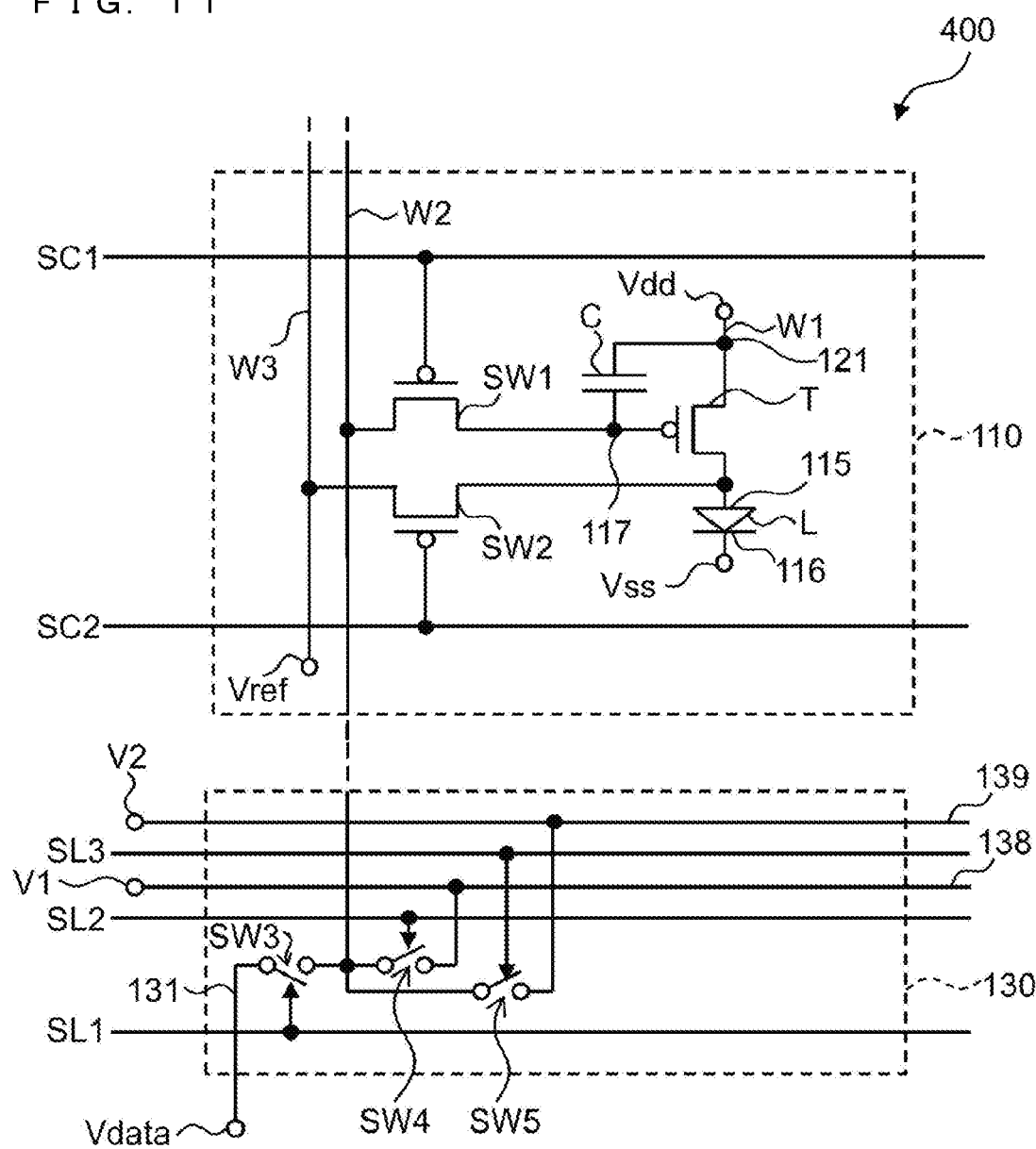
FIG. 11 is a diagram illustrating a configuration of a display apparatus according to a third embodiment.

FIG. 11 is a diagram illustrating a configuration of a display apparatus 400 according to a third embodiment. The display apparatus 400 according to the third embodiment has the same configuration as the display apparatus 300 according to the second embodiment, except that a third selection signal SL3, a fifth switch SW5, and a second voltage line 139 to which a second voltage V2 is applied are added. Accordingly, the same elements as in FIG. 2 will be referenced by the same reference numerals, description of the second embodiment is incorporated herein by reference, and description thereof will not be repeated. The switching circuit 130 of the display apparatus 400 selectively applies the second voltage V2 in addition to the image signal voltage Vdata and the first voltage V1 to the second wiring W2. That is, the switching circuit 130 switches the voltage applied to the second wiring W2 in the order of the second voltage V2, the first voltage V1, and the image signal voltage Vdata. The reference voltage Vref is the same as in FIG. 7.

Figure 12:
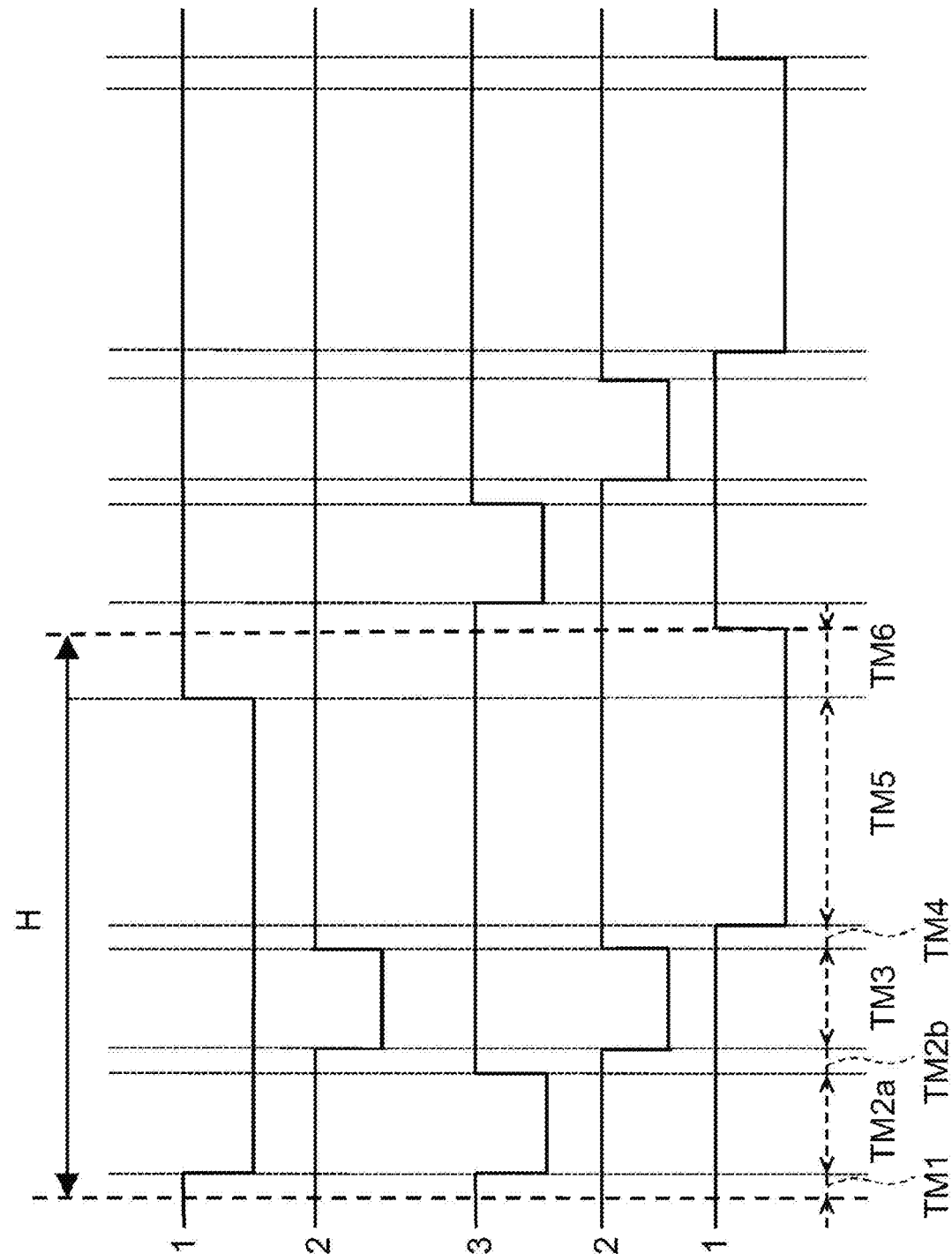
FIG. 12 is a timing chart illustrating an example of an operation in the circuit illustrated in FIG. 11.

FIG. 12 is a timing chart illustrating an example of an operation in the circuit of the display apparatus 400 illustrated in FIG. 11. Similarly to the timing chart illustrated in FIG. 7, in the timing chart illustrated in FIG. 12, in the first period TM1 of the horizontal synchronization period H, all the first scan signal SC1, the second scan signal SC2, the first selection signal SL1, and the second selection signal SL2 are OFF and the third selection signal SL3 is also OFF. In the period TM2a, the first scan signal SC1 and the third selection signal SL3 are changed to ON, and the first switch SW1 and the fifth switch SW5 are switched to the connected state. Accordingly, the second voltage V2 is applied to the gate electrode 117. Subsequently, the third selection signal SL3 is changed to OFF in the period TM2b, and the second selection signal SL2 and the second scan signal SC2 are changed to ON in the period TM3. Accordingly, the fourth switch SW4 is switched to the connected state, the first voltage V1 is applied to the gate electrode 117, the second switch SW2 is switched to the connected state, and the reference voltage Vref is applied to the anode electrode 115. That is, in the period in which the first voltage V1 is applied to the second wiring W2, the second switch SW2 is switched to the connected state. Here, the second voltage V2 can be set to equal to or higher than the highest voltage applied to the image signal line 131. The second voltage V2 can be set to be equal to or higher than the voltage corresponding to the minimum luminance. Accordingly, the transistor T can be switched to the disconnected state to perform display of stopping the emission of light in the previous frame.

Figure 13:
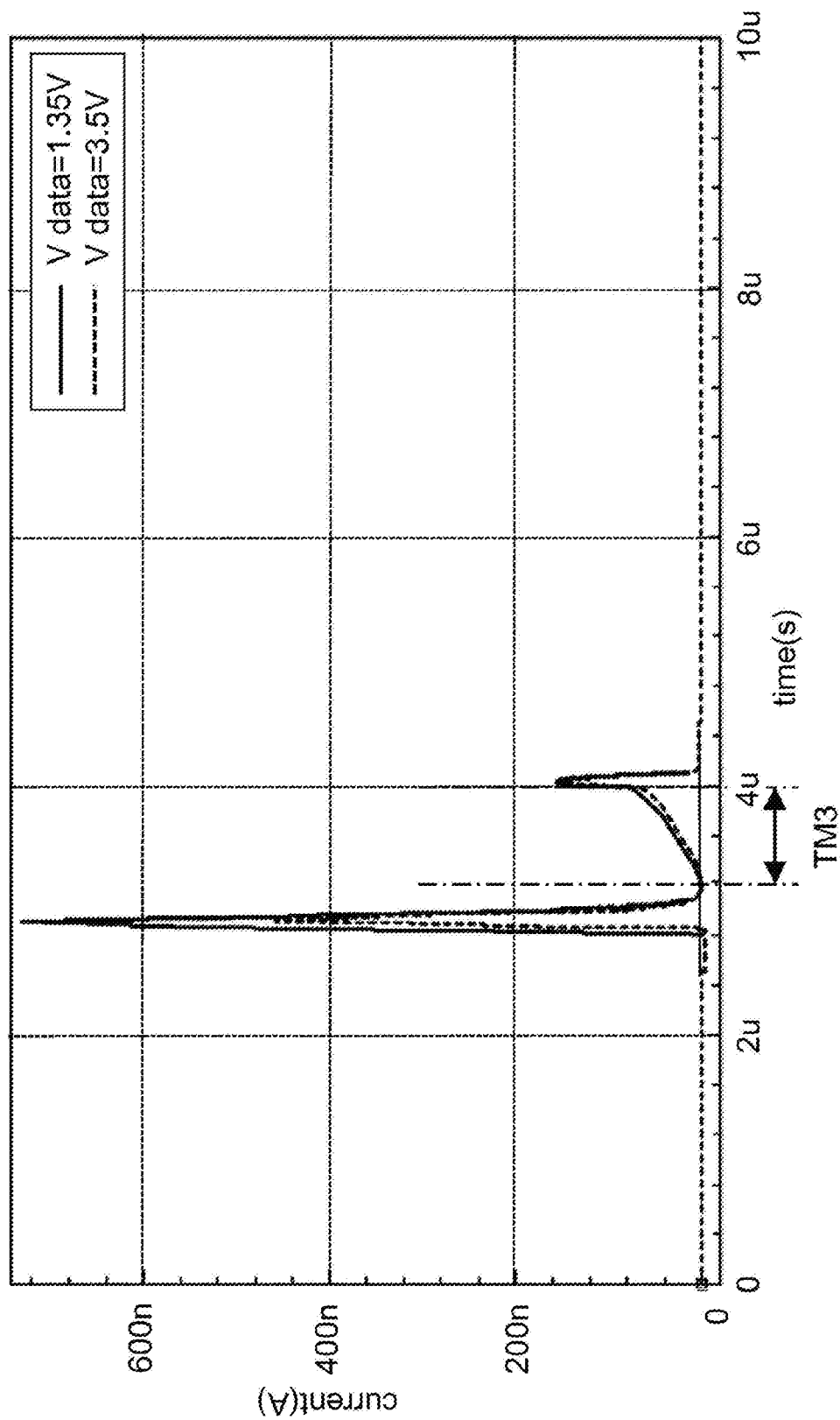
FIG. 13 is a graph illustrating a simulation result of the current flowing in the second switch in the timing chart illustrated in FIG. 12.

FIG. 13 is a graph illustrating a simulation result of the current flowing in the second switch SW2 in the timing chart illustrated in FIG. 12. Similarly to FIG. 9, the current flowing in the second switch SW2 is the current flowing from the anode electrode 115 to the third wiring W3. The voltage indicated by a solid line in FIG. 13 is the same as the voltage indicated by the solid line in FIG. 9. The voltage indicated by a broken line in FIG. 13 is the same as the voltage indicated by the broken line in FIG. 9. In the third period TM3 in which the first voltage V1 is applied to the gate electrode 117 and the second switch SW2 is switched to the connected state, the transistor T is maintained in the ON state. However, as illustrated in the graph, the current flowing in the second switch SW2 is suppressed to 0 to 75 nA in both of the case of the image signal voltage Vdata (=1.35 V) with the maximum luminance and the case of the image signal voltage Vdata (=3.5 V) with the minimum luminance.

In the period in which the first switch SW1 is in the connected state, the switching circuit 130 switches the connection to the second wiring W2 in the order of the second voltage line 139, the first voltage line 138, and the image signal line 131. That is, in the display apparatus according to this embodiment, the second voltage V2 is applied to the gate electrode 117 before the transistor T is switched to the ON state in the third period TM3. Accordingly, the current value flowing in the third period TM3 in each frame can be equalized. By setting the second voltage V2 to be equal to or higher than the highest voltage applied to the image signal line or to be equal to or higher than the voltage corresponding to the minimum luminance, it is possible to suppress emission of light from the light emitting element L at the time of application of the first voltage V1 and to decrease the current consumption in the third period TM3. Since all the configurations of the second embodiment are included, the advantages of the second embodiment can be achieved. In this embodiment, since the second switch SW2 is switched to the connected state in the period in which the switching circuit 130 connects the second wiring W2 and the first voltage line 138, it is possible to apply the image signal voltage Vdata after switching the transistor T to the ON state without causing the light emitting element L to emit light.

[Fourth Embodiment]

Figure 14:
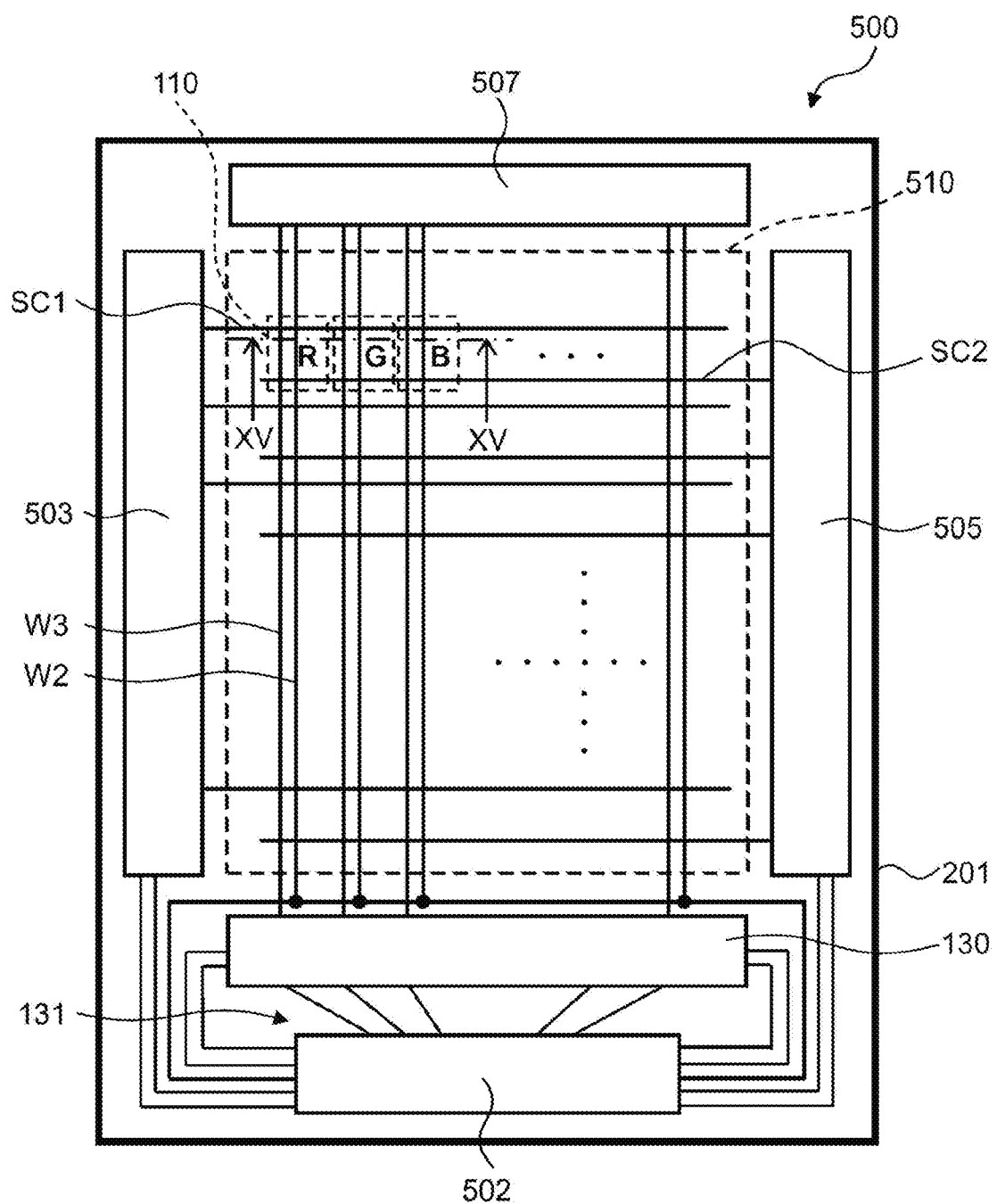
FIG. 14 is a diagram illustrating a configuration of a display apparatus according to a fourth embodiment.

FIG. 14 is a diagram illustrating a configuration of a display apparatus according to a fourth embodiment. As illustrated in the drawing, the display apparatus 500 includes a circuit formed on an insulating substrate 201 such as a glass substrate. A plurality of pixels 110 are arranged in a display region 510. Since the configurations of each pixel 110 and the switching circuit 130 can be the same as the configurations of each pixel 110 and the switching circuit 130 according to any one of the second and third embodiments, description of the second and third embodiments is incorporated herein by reference, and description thereof will not be repeated.

The light emitting elements L disposed in each pixel 110 are three types of light emitting elements L of R (Red), G (Green), and B (Blue) and display multiple colors. However, multiple color display may be performed by combination of other colors, or the display apparatus 500 may display a single color. As described in the second embodiment, a first scan driving circuit 503 supplies the first scan signal SC1 to the pixels 110. A second scan driving circuit 505 supplies the second scan signal SC2 to the pixels 110. Here, the first scan driving circuit 503 and the second scan driving circuit 505 are together referred to as a scan driving circuit. As described above in the second embodiment, the first wiring W1, the second wiring W2, and the third wiring W3 are arranged in each pixel 110. The above description of the switching circuit 130 will not be repeated.

A driving integrated circuit 502 applies a voltage common to the pixels 110 in a display region 510 to the third wiring W3. The second wiring W2 and the third wiring W3 are connected to an electrostatic discharge (ESD) protection circuit 507 which is opposite to the switching circuit 130 across the display region 510. The ESD protection circuit 507 is a circuit that allows static electricity entering the second wiring W2 or the third wiring W3 to flow to the ground potential. The driving integrated circuit 502 additionally outputs a signal for controlling the first scan driving circuit 503 and the second scan driving circuit 505, and outputs the image signal voltage Vdata to the switching circuit 130 to control various switches of the switching circuit 130.

This embodiment employs the same configuration as illustrated in FIG. 14, but is not limited to the configuration. For example, the first scan driving circuit 503 and the second scan driving circuit 505 are arranged with the display region 510 interposed therebetween, but may be arranged on the same side. A configuration not including the ESD protection circuit 507 may be employed. The switching circuit 130 may be included in the scan driving circuit with a meaning including one or both of the first scan driving circuit 503 and the second scan driving circuit 505. The circuit configuration of the pixel 110 and the configuration and the operating timing of the switching circuit 130 can be similar to details described in the second embodiment or the third embodiment. However, operating timings other than those described in the second embodiment and the third embodiment may be used.

Figure 15:
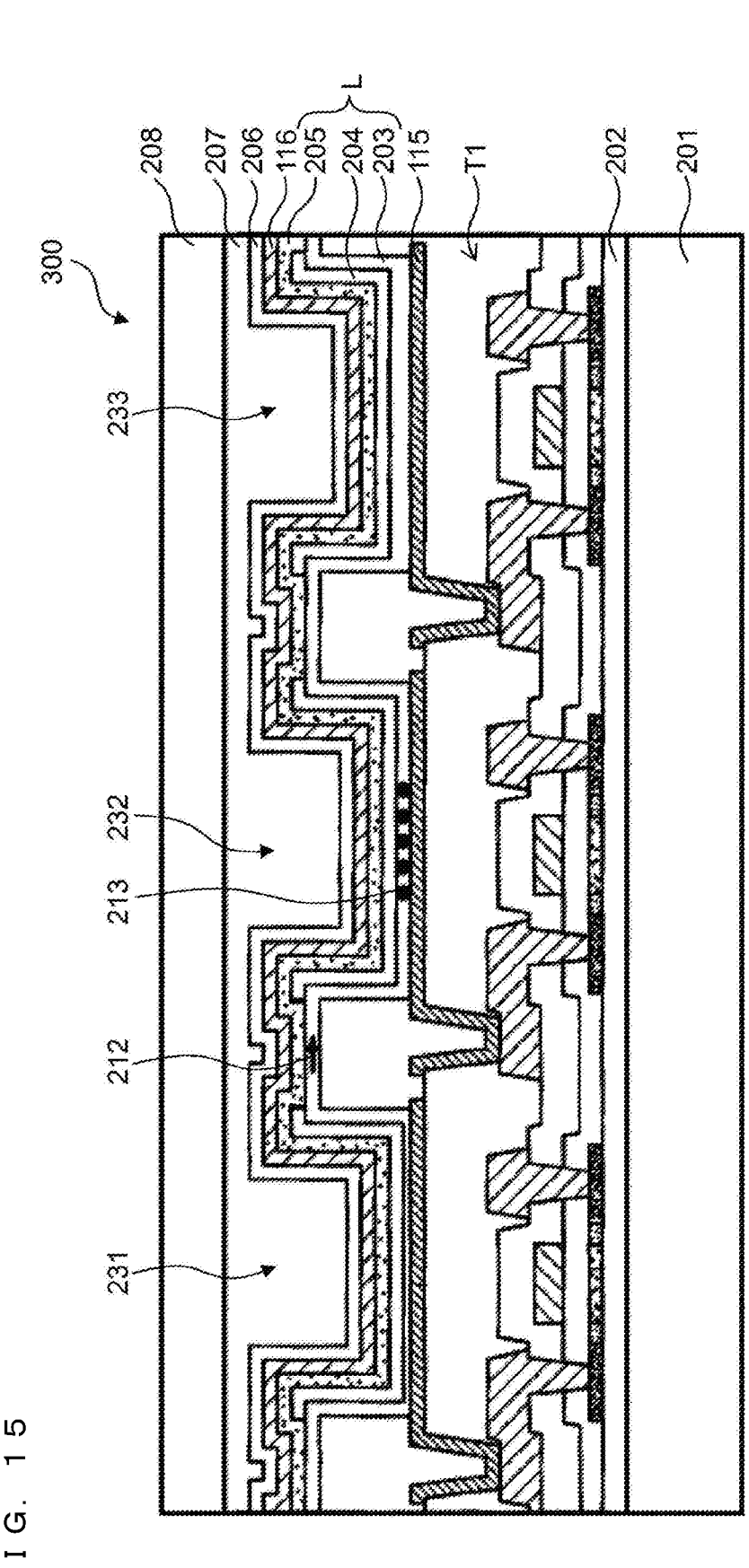
FIG. 15 is a cross-sectional view taken along line XV-XV in FIG. 14.

FIG. 15 is a cross-sectional view taken along line XV-XV in FIG. 14 and is a cross-sectional view in which three pixels 110 of RGB of the display apparatus 500 are arranged. In the cross-sectional view illustrated in FIG. 15, an R pixel 231 emitting light in a red wavelength range, a G pixel 232 emitting light in a green wavelength range, and a B pixel 233 emitting light in a blue wavelength range are arranged in the cross-section, but the pixels 110 emitting light in any wavelength range such as emitting light in the same wavelength range may be arranged. In FIG. 15, the same layers as in the cross-sectional view illustrated in FIG. 4 will be referenced by the same reference numerals and description thereof will not be repeated.

In the drawing, the light emitting element L includes a common layer 203, a light emitting layer 204, and a cathode base layer 205. The common layer 203 is a layer including a hole injection layer (HIL) and a hole transport layer (HTL). The light emitting layer 204 is a layer emitting light in a red wavelength range, light in a green wavelength range, and light in a blue wavelength range from the R pixel 231, the G pixel 232, and the B pixel 233, respectively. The cathode base layer 205 is a layer including an electron injection layer (EIL) and an electron transport layer (ETL).

Here, each pixel emits light based on a gray-scale value input in each frame, and an example of a frame in which the R pixel 231 emits light and the G pixel 232 does not emit light will be considered. As indicated by an arrow 212, a part of holes generated in the common layer 203 of the R pixel 231 may flow into the common layer 203 of the neighboring G pixel 232 to cause the G pixel 232 to emit light. This unintended emission of light is referred to as a crosstalk.

However, in the second and third embodiments, in at least the third period TM3 in FIGS. 7 and 12, the reference voltage Vref is applied. When the reference voltage Vref, that is, the voltage of the third wiring W3, is set to be equal to or lower than the voltage obtained by adding the threshold voltage Vtholed of the light emitting element L to the voltage of the cathode electrode 116, electrons 213 can be accumulated in the common layer 203 of the neighboring G pixel 232 as illustrated in FIG. 15.

That is, the light emitting element L has self-capacitance to maintain the voltage between the anode electrode 115 and the cathode electrode 116 at a voltage which is equal to or lower than a sum of the threshold voltage of the light emitting element L and the voltage of the cathode electrode 116, when the light emitting element L is controlled not to emit light by circuit, for example switching circuit 130 (for a vertical scanning period in which a displayed image is refreshed when the organic light emitting device not to emit light). Accordingly, even when holes flow in the emission period as indicated by the arrow 212, the flowing holes can be cancelled by the electrons 213 accumulated before the emission period to suppress emission of light from the neighboring G pixel 232. Here, the G pixel 232 is described in FIG. 15, but emission of light due to flowing of holes from a neighboring pixel can also be prevented in a pixel emitting light in any wavelength range. That is, it is possible to suppress occurrence of a crosstalk. When the light emitting element L emits light in the green wavelength range, the light emitting layer 204 has particularly high emission efficiency and easily causes a crosstalk. Accordingly, by applying this embodiment to the light emitting element L emitting light in the green wavelength range, it is possible to prevent visual observation of light emitted due to a crosstalk.

In this embodiment, the same operation as in the timing chart illustrated in FIG. 7 or 12 is assumed, but when the image signal voltage is a voltage indicating non-emission, the second switch SW2 may be switched to the connected state over the emission period of one frame. Accordingly, it is possible to prevent occurrence of a crosstalk over the whole emission period of one frame.

Figure 16:
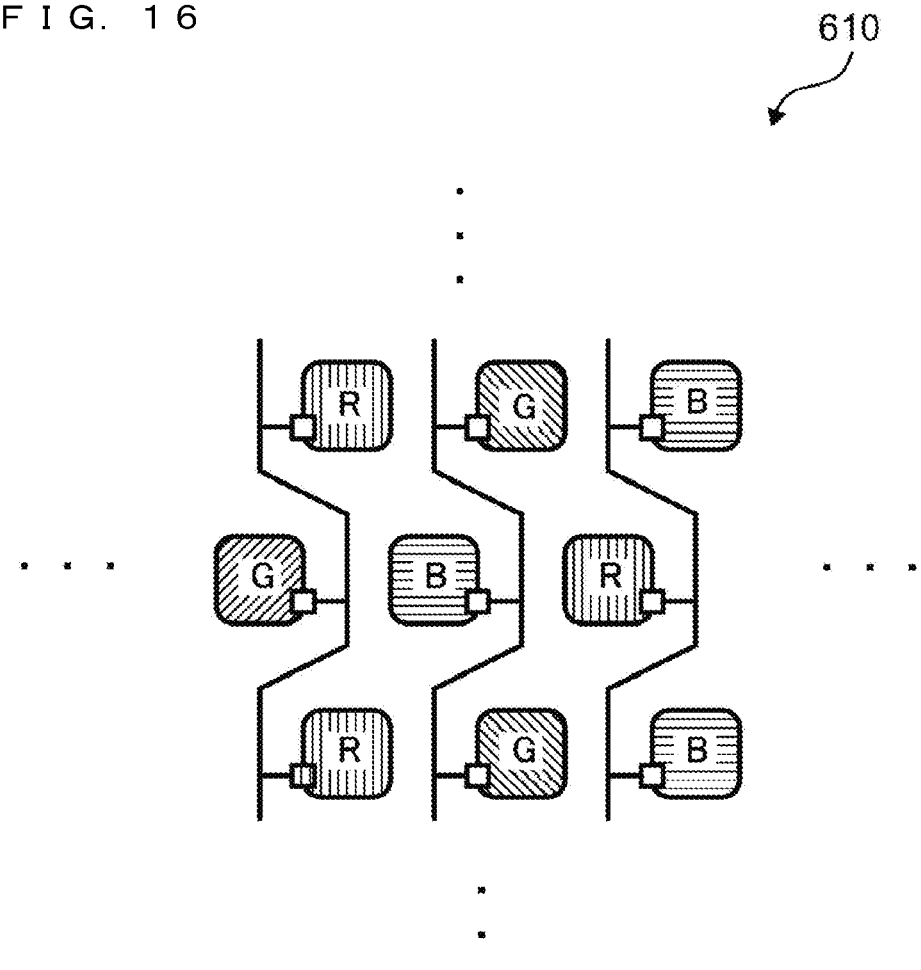
FIG. 16 is a diagram illustrating an example of a pixel arrangement.

FIG. 16 is a diagram illustrating an example of a pixel arrangement in this embodiment. In the drawing, nine pixels (sub pixels) among the pixels arranged in the display region 510 are illustrated. As illustrated in the drawing, the pixels are arranged in a so-called RGB delta pixel arrangement 610. In the RGB delta pixel arrangement 610, a row in which an R pixel, a G pixel and a B pixel are repeatedly arranged along the line to which the first scan signal SC1 is applied and a row in which a G pixel, a B pixel, and an R pixel are repeatedly arranged are alternately disposed.

Figure 17:
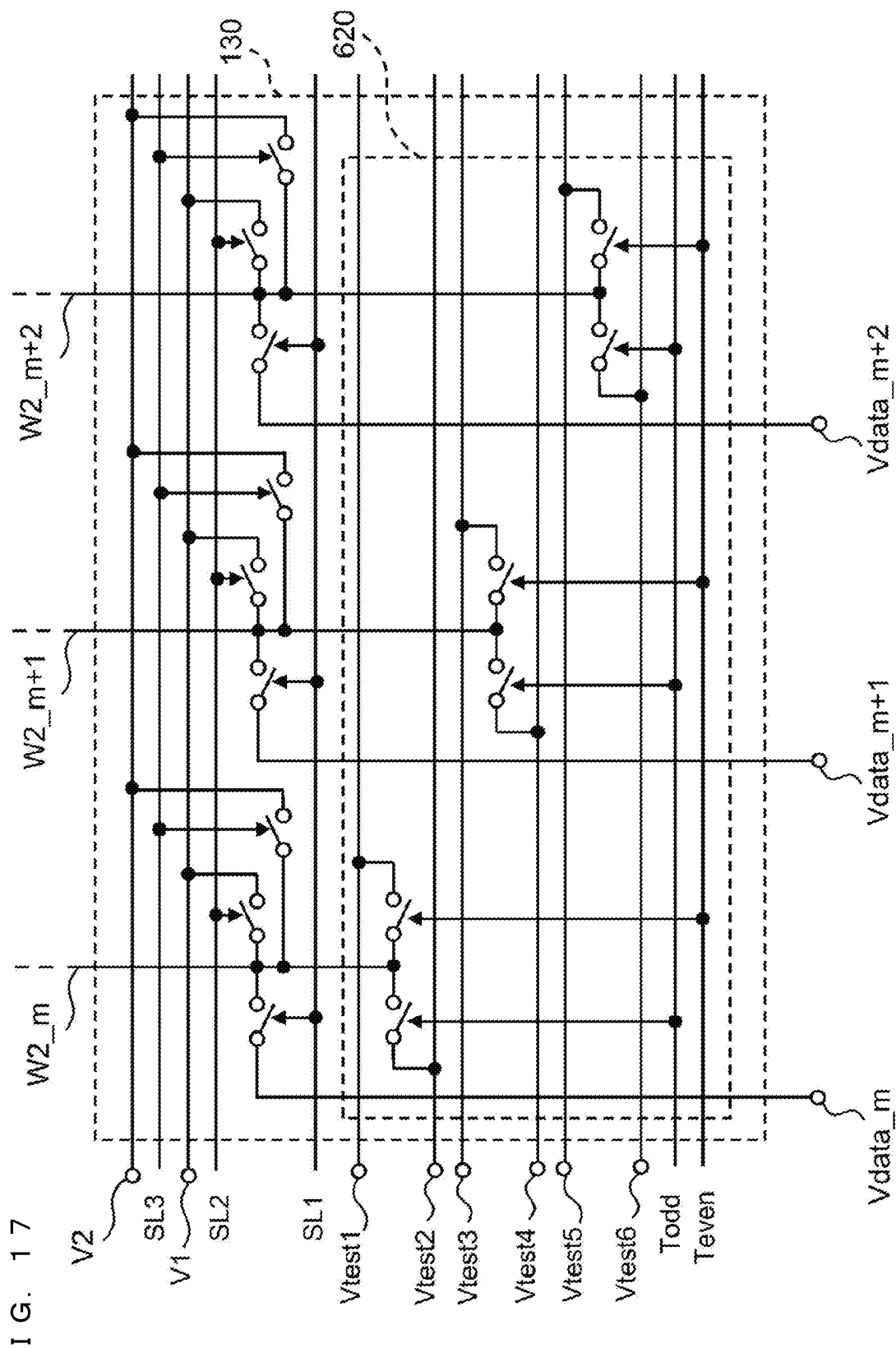
FIG. 17 is a diagram illustrating an example of an inspection circuit that executes lighting inspection of pixels in a RGB delta pixel arrangement.

FIG. 17 is a diagram illustrating an example of an inspection circuit 620 that executes lighting inspection of the pixels of the RGB delta pixel arrangement 610 illustrated in FIG. 16. As illustrated in the drawing, the inspection circuit 620 is disposed in the switching circuit 130. The inspection circuit 620 includes a wiring W2_m which is an m-th (where m is an integer equal to or greater than 0) wiring W2, a wiring W2_m+1 which is an (m+1)-th wiring W2, and a wiring W2_m+2 which is an (m+2)-th wiring W2.

The wiring W2_m is supplied with a first test voltage Vtest1 by changing a signal Teven to an ON state and is supplied with a second test voltage Vtest2 by changing a signal Todd to the ON state. The wiring W2_m+1 is supplied with a third test voltage Vtest3 by changing the signal Teven to the ON state and is supplied with a fourth test voltage Vtest4 by changing the signal Todd to the ON state. The wiring W2_m+2 is supplied with a fifth test voltage Vtest5 by changing the signal Teven to the ON state and is supplied with a sixth test voltage Vtest6 by changing the signal Todd to the ON state. For example, a case in which the nine pixels illustrated in FIG. 16 are arranged in an odd-numbered row, an even-numbered row, and an odd-numbered row and in the m-th column, the (m+1)-th column, and the (m+2)-th column is assumed. In this assumption, when a potential causing emission of light is applied as the second test voltage Vtest2 and the fifth test voltage Vtest5, the lighting test of a single color of the R pixels can be performed by alternately changing the signal Todd and the signal Teven to the ON state. Accordingly, the lighting test of a single color in the RGB delta pixel arrangement 610 can be performed using six test voltage lines of the first to sixth test voltages Vtest1 to Vtest6 and two control lines for the signal Todd and the signal Teven. In the case of a so-called vertical stripe type pixel arrangement in which columns of the same color pixels of RGB are arranged, the lighting test can be performed using three test voltage lines and one control line.

The technical features (configurations) described in the embodiments can be combined and a new technical feature can be generated by the combination. It is to be noted that the disclosed embodiment is illustrative and not restrictive in all aspects. The scope of the disclosure is defined by the appended claims rather than by the description preceding them, and all changes that fall within metes and bounds of the claims, or equivalence of such metes and bounds thereof are therefore intended to be embraced by the claims.

It is to be noted that, as used herein and in the appended claims, the singular forms "a", "an", and "the" include plural referents unless the context clearly dictates otherwise.

What is claimed is:

1. A display apparatus comprising:
   a first wiring, a second wiring, and a third wiring;
   a light emitting element configured to emit light by a current flowing between an anode electrode and a cathode electrode;
   a driving transistor configured to control a current which is supplied from the first wiring to the anode electrode;
   a first switch configured to connect or disconnect the second wiring and a gate electrode of the driving transistor;
   a second switch configured to connect or disconnect the third wiring and the anode electrode; and
   a switching circuit configured to selectively apply one of an image signal voltage and a first voltage to the second wiring,
   wherein the first voltage is a voltage for causing a current equal to or larger than a minimum current to flow to the driving transistor such that a hysteresis of the driving transistor is maintained in a channel ON state,
   when the light emitting element is controlled not to emit light, the first voltage is applied to the gate electrode of the driving transistor,
   the switching circuit switches the voltage applied to the second wiring in the order of a second voltage which is equal to or higher than a highest value of the image signal voltage, the first voltage, and the image signal voltage in the period in which the first switch is in the connected state, and
   the second switch is in the connected state in the period in which the first voltage is applied to the second wiring, and the voltage of the third wiring is applied to a source electrode of the driving transistor via the second switch.

2. The display apparatus according to claim 1, wherein a period in which the first switch is in a connected state, a period in which the second switch is in a connected state, and a period in which the switching circuit applies the first voltage to the second wiring overlap each other.

3. The display apparatus according to claim 2, wherein the switching circuit switches the voltage applied to the second wiring from the first voltage which is equal to or more than a threshold voltage of the driving transistor to the image signal voltage in the period in which the first switch is in the connected state, and
the driving transistor flows the current which is supplied from the first wiring, to the anode electrode, by applying the first voltage to the gate of the driving transistor.

4. The display apparatus according to claim 1, wherein the light emitting element has self-capacitance to maintain a voltage between the anode electrode and the cathode electrode at a voltage which is equal to or lower than a sum of a threshold voltage of the light emitting element and the voltage of the cathode electrode when the light emitting element is controlled not to emit light, and
the voltage of the third wiring is equal to or lower than a sum of the threshold voltage of the light emitting element and the voltage of the cathode electrode.

5. The display apparatus according to claim 4, wherein the second switch is in the connected state over an emission period of one frame when the image signal voltage is a voltage indicating non-emission.

6. The display apparatus according to claim 1, wherein the first voltage is higher than the voltage of the cathode electrode.

7. The display apparatus according to claim 1, further comprising a capacitor which is connected between the gate electrode and the source electrode of the driving transistor.

8. The display apparatus according to claim 1, wherein the third wiring is formed in a layer different from a layer in which the second wiring is formed.

9. The display apparatus according to claim 1, wherein the third wiring extends in parallel to the second wiring.

10. The display apparatus according to claim 1, wherein the third wiring is connected to the cathode electrode.

11. The display apparatus according to claim 1, wherein the first voltage is a voltage which is equal to or lower than a lowest value of the image signal voltage.

12. The display apparatus according to claim 1, wherein the first voltage is higher than the voltage which is applied to the third wiring.

13. The display apparatus according to claim 1, further comprising:
    a display region including a plurality of pixel circuits of which each includes the light emitting element, the driving transistor, the first switch, and the second switch;
    a scan driving circuit configured to supply a first scan signal to control a connection state of the first switch of each pixel circuit and a second scan signal to control a connection state of the second switch; and
    a driving integrated circuit configured to supply a signal to control the scan driving circuit to the scan driving circuit and to supply a signal to control the switching circuit to the switching circuit.

14. A display method of a display apparatus including a driving transistor that controls a current flowing from a first wiring to an anode electrode of a light emitting element by a voltage of a gate electrode, the display method comprising:

applying a voltage of a third wiring to the anode electrode of the light emitting element;

applying a first voltage to the gate electrode; and applying an image signal voltage to the gate electrode after stopping both the applying of the voltage of the third wiring to the anode electrode and the applying of the first voltage to the gate electrode, wherein when the light emitting element is controlled not to emit light, the first voltage for causing a current equal to or larger than a minimum current to flow to the driving transistor such that a hysteresis of the driving transistor is maintained in a channel ON state, is applied to the gate electrode of the driving transistor, after applying a second voltage which is equal to or higher than a highest value of the image signal voltage to the gate electrode, the first voltage is applied to the gate electrode, and in the period in which the first voltage is applied to the gate electrode, the third wiring and the anode electrode are in the connected state, and the voltage of the third wiring is applied to a source electrode of the driving transistor.

15. A display apparatus comprising:
a first wiring, a second wiring, and a third wiring;
a light emitting element configured to emit light by a current flowing between an anode electrode and a cathode electrode;
a driving transistor configured to control a current which is supplied from the first wiring to the anode electrode;
a first switch configured to connect or disconnect the second wiring and a gate electrode of the driving transistor;
a second switch configured to connect or disconnect the third wiring and the anode electrode; and
a switching circuit configured to selectively apply one of an image signal voltage and a first voltage to the second wiring, wherein the light emitting element has self-capacitance to maintain a voltage between the anode electrode and the cathode electrode at a voltage which is equal to or lower than a sum of a threshold voltage of the light emitting element and the voltage of the cathode electrode, the voltage of the third wiring is equal to or lower than a sum of the threshold voltage of the light emitting element and the voltage of the cathode electrode, and when the light emitting element is controlled not to emit light, the first switch connects the second wiring and the gate electrode of the driving transistor, so as to apply, to the gate electrode of the driving transistor, the first voltage for causing a current equal to or larger than a minimum current to flow to the driving transistor such that a hysteresis of the driving transistor is maintained in a channel ON state, and the second switch connects the third wiring and the anode electrode, so as to flow a current from the driving transistor to the third wiring, the switching circuit switches the voltage applied to the second wiring in the order of a second voltage which is equal to or higher than a highest value of the image signal voltage, the first voltage, and the image signal voltage in the period in which the first switch is in the connected state, and the second switch is in the connected state in the period in which the first voltage is applied to the second wiring, and the voltage of the third wiring is applied to a source electrode of the driving transistor via the second switch.

* * * * *